(12) United States Patent
Hashikawa et al.

(10) Patent No.: US 6,576,910 B2
(45) Date of Patent: Jun. 10, 2003

(54) SAMPLE HOLDER, SAMPLE MOUNT AND SAMPLE MOUNT JIG FOR USE IN ELECTRON MICROSCOPE

(75) Inventors: Naoto Hashikawa, Tokyo (JP); Koji Fukumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 55 days.

(21) Appl. No.: 09/825,827

(22) Filed: Apr. 5, 2001

(65) Prior Publication Data

US 2002/0005492 A1 Jan. 17, 2002

(30) Foreign Application Priority Data

Jul. 13, 2000 (JP) ........................................ 2000-212538

(51) Int. Cl.$^7$ ................................................. G21K 5/10
(52) U.S. Cl. .................................. 250/442.11; 250/311
(58) Field of Search .................... 250/306–311, 442.11, 250/440.11

(56) References Cited

U.S. PATENT DOCUMENTS

| | | | | |
|---|---|---|---|---|
| 3,643,091 A | * | 2/1972 | Lucas | .................... 250/442.11 |
| 4,499,670 A | * | 2/1985 | Tvedt et al. | ................. 100/233 |
| 4,672,797 A | * | 6/1987 | Hagler | ................... 250/440.11 |
| 5,225,683 A | * | 7/1993 | Suzuki et al. | ................. 250/311 |
| 6,388,262 B1 | * | 5/2002 | Alani et al. | .................. 250/311 |
| 6,414,322 B1 | * | 7/2002 | Carroll | ................... 250/442.11 |

* cited by examiner

Primary Examiner—John R. Lee
Assistant Examiner—Christopher M. Kalivoda
(74) Attorney, Agent, or Firm—Oblon, Spivak, McClelland, Maier & Neustadt, P.C.

(57) ABSTRACT

An object is to provide a sample holder and a sample mount which allow observation of a sample from many directions in an electron microscope. A sample holder (10) is made for use in a transmission electron microscope (TEM). In the TEM, an electron beam is incident in the Z direction. A sample mount (17) and a sample (SA) affixed on it can be rotated by a motor (12) in the range of 0 to 360° on an axis extending in the Y direction which differs from the direction of the electron beam incidence. Therefore the electron beam can enter the observed sample (SA) from many directions, thus allowing observation of the sample (SA) from many directions. It is also possible to FIB-process the sample (SA) in many directions without removing the sample (SA) from the sample holder (10), which facilitates the handling in the FIB processing.

12 Claims, 16 Drawing Sheets

F/G. 1

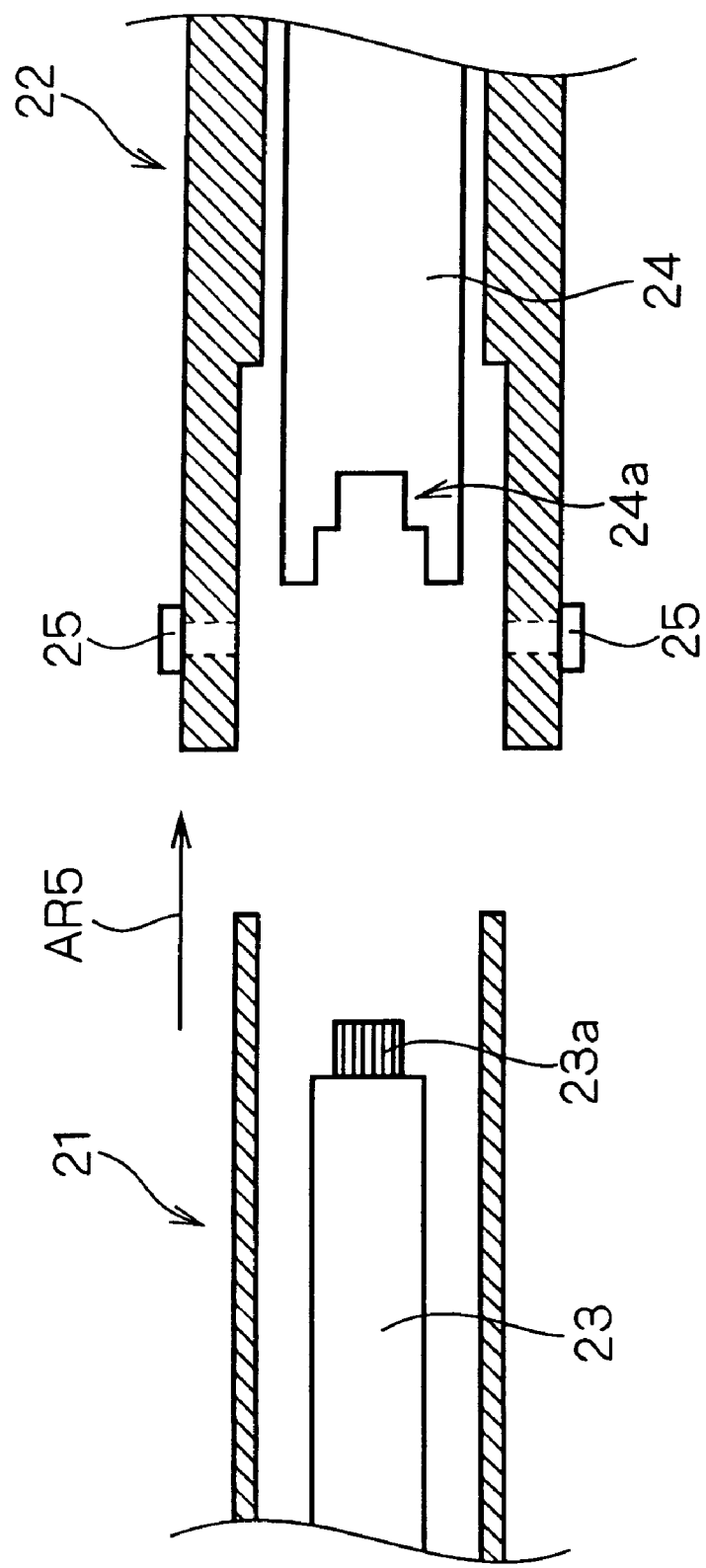

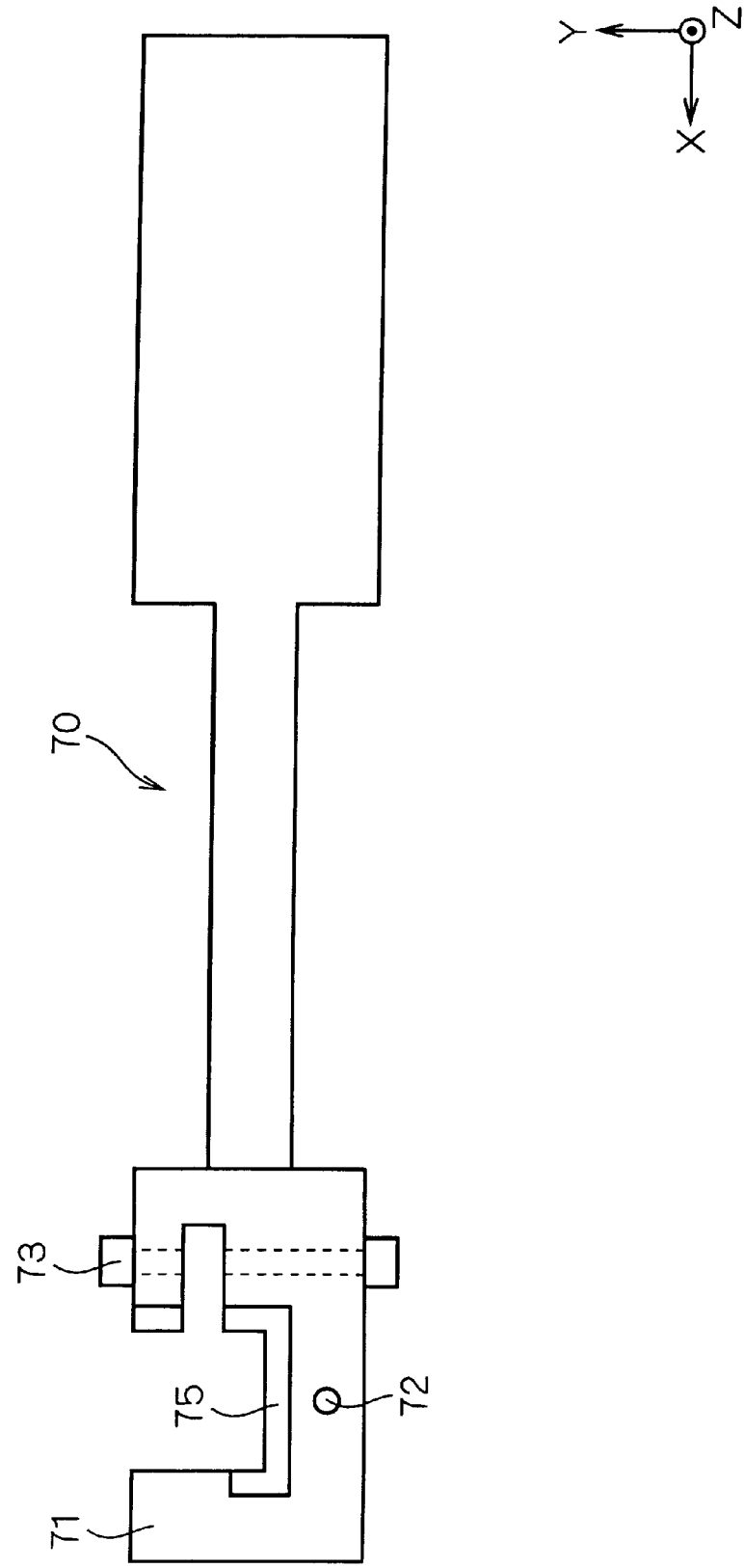

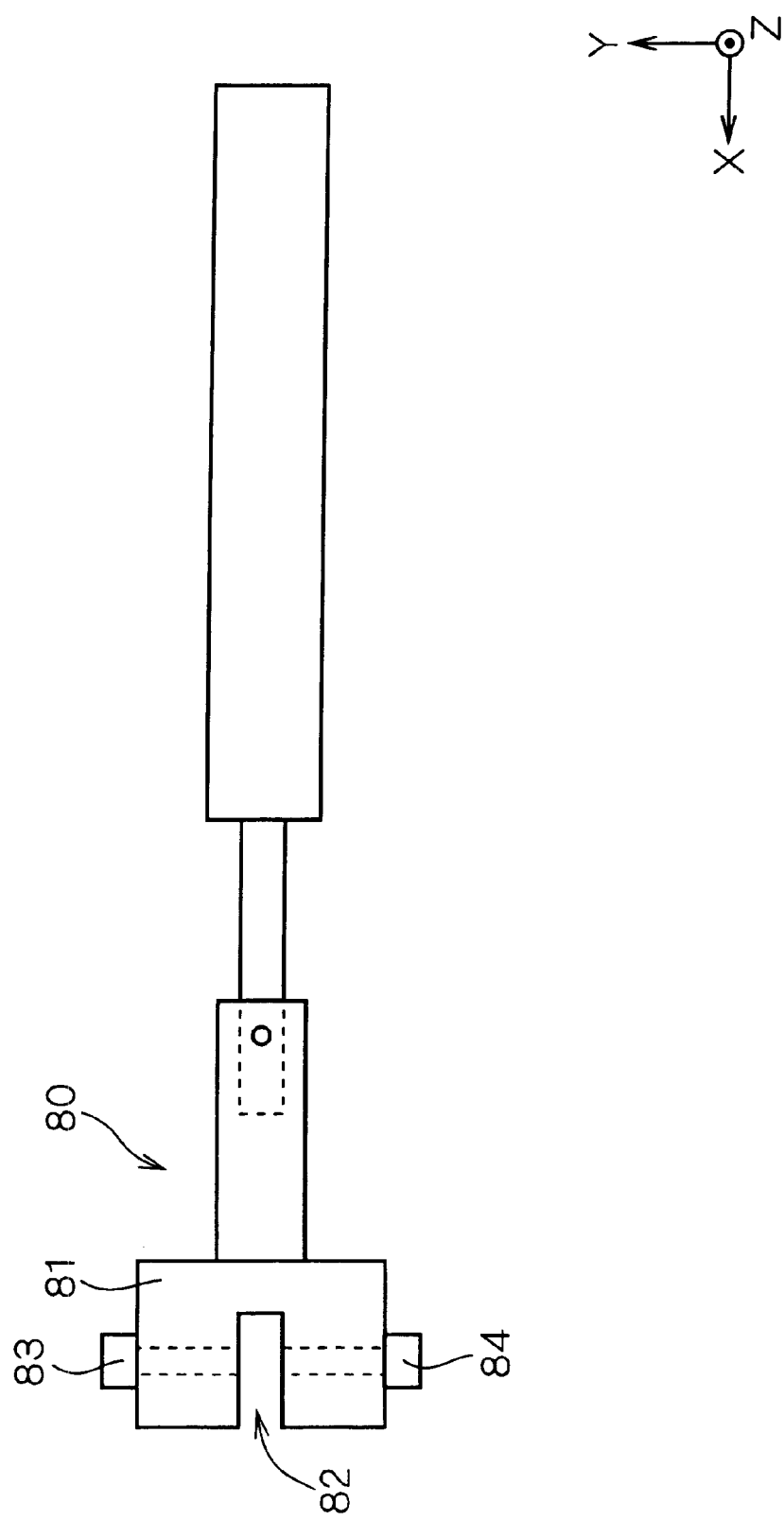

SAMPLE HOLDER, SAMPLE MOUNT AND SAMPLE MOUNT JIG FOR USE IN ELECTRON MICROSCOPE

BACKGROUND OF THE INVENTION

1. Field of the Invention

The present invention relates to a sample holder for holding a sample to be observed in an electron microscope such as a transmission electron microscope, a sample mount on which the sample is affixed, and a sample mount jig for grasping and holding the sample mount.

2. Description of the Background Art

Structural evaluation using an electron microscope has been conventionally employed as one of methods for examining and evaluating semiconductor devices. The electron microscopes mainly include the scanning electron microscopes (SEM) and the transmission electron microscopes (TEM). In the SEM, a beam of electrons is applied to a cleavage plane or an FIB (Focused Ion Beam) processed plane of the sample being observed (observed sample) and secondary electrons etc. obtained from there form an image for observation. In the TEM, a beam of electrons is transmitted through a very thin, 1 µm thick or less, observed sample and transmitted electrons and scattered electrons (elastically scattered electrons) form an image for observation of the internal structure of the sample.

FIGS. 19A and 19B are diagrams showing a generally used conventional TEM sample holder. FIG. 19A is a plane view of the conventional TEM sample holder and FIG. 19B is a front view showing the structure. A sample 105 to be observed, e.g. a semiconductor device, is set on a sample mount 101 provided at an end of the sample holder 100. The observed sample 105 is shaped like a plate having a film thickness of 0.5 µm or less in the direction of incidence of the electron beam (Z direction). The part where the observed sample 105 is set on the sample mount 101 is a pole piece element, which is opened above and below the observed sample 105 (in the Z direction) to allow passage of the electron beam.

The TEM sample holder 100 shown in FIGS. 19A and 19B is a so-called two-axis inclined sample holder which has been conventionally used, where the observed sample 105 can be turned and inclined about axes in the X direction and the Y direction. FIG. 20 shows the observed sample 105 turned and inclined on the axis extending along the X direction (hereinafter referred to as X-axis inclination). In the drawing, the arrow AR20 shows the direction of incidence of the electron beam, i.e. the direction of observation. The X-axis inclination is achieved by a goniometer attached to the body of the TEM; the entirety of the TEM sample holder 100 turns on the axis in the X direction. As the TEM sample holder 100 turns, the sample mount 101 and the observed sample 105 set on it turn and incline, too. In the conventional TEM sample holder 100, the X-axis inclination is possible within a maximum inclination angle of ±30°.

FIG. 21 is a diagram showing the observed sample 105 turned and inclined on the axis extending in the Y direction (hereinafter referred to as Y-axis inclination). The arrow AR21 in the diagram shows the direction of incidence of the electron beam, i.e. the direction of observation. In the Y-axis inclination, a motor provided in the TEM sample holder 100 turns the sample mount 101. As the sample mount 101 turns relative to the TEM sample holder 100 on the axis in the Y direction, the observed sample 105 set on it, too, turns and inclines accordingly. In the conventional sample mount 101, the Y-axis inclination is possible within a maximum inclination angle of ±30°.

Thus, with the conventional two-axis inclined sample holder, the observed sample 105 can be observed from desired directions, e.g. from a particular orientation of the crystal structure, through the X-axis inclination and the Y-axis inclination of the observed sample 105.

The recent remarkable advances in manufacture of the semiconductor devices are achieving finer and more complicated structures and therefore more detailed structural evaluations are needed. It is hence desirable to observe the semiconductor device from a greater number of directions.

However, the conventional X-axis inclination and Y-axis inclination can be made within the limited ranges (e.g. ±30°) and therefore the semiconductor device can be observed only in the limited ranges. It has been hence extremely difficult to observe the semiconductor device in many directions.

The processing by FIB is now attracting particular interests as a technique for forming the thin-film sample 105 from a semiconductor device. The FIB usually uses Ga liquid metal etc. as the ion source; an ion beam focused to several micrometers or less scans the object to sputter-etch a particular area, whereby the area to be observed can be precisely obtained as a thin film. The observed sample 105 formed by the FIB processing is so small that its handling is complicated and difficult. Therefor it will be convenient if the FIB process can be applied to a sample being mounted on a TEM sample holder.

SUMMARY OF THE INVENTION

According to a first aspect of the present invention, a sample holder for holding a sample to be observed in an electron microscope comprises: a sample mount on which the sample is affixed; and a rotation driving mechanism for rotating the sample mount about a predetermined axis in the range of 0 to 360°.

Preferably, according to a second aspect, in the sample holder, the rotation driving mechanism rotates the sample mount in the range of 0 to 360° about an axis extending along a direction other than the direction of electron beam incidence in the electron microscope.

Preferably, according to a third aspect, the sample holder further comprises a cartridge portion coupled to the sample mount and a fixed portion coupled to the main body of the sample holder, wherein the cartridge portion can be attached to and removed from the fixed portion.

A fourth aspect is directed to a sample mount jig for grasping and holding a sample mount provided in a sample holder for holding a sample to be observed in an electron microscope. According to the fourth aspect, the sample mount jig comprises: a protecting portion for covering the sample affixed on the sample mount when the sample mount jig is grasping the sample mount; and a grip portion fixed to the protecting portion.

A fifth aspect is directed to a sample mount on which a sample to be observed is affixed and which is provided in a sample holder for holding the sample in an electron microscope. According to the fifth aspect, the sample mount comprises: a mount plate having a gap whose width is narrower than the length of the sample, for supporting the sample affixed thereon, wherein the sample is laid over opposite portions of the gap of the mount plate.

Preferably, according to a sixth aspect, the sample mount is composed of the mount plate and a support plate for supporting the mount plate, the mount plate and the support plate being combined in the shape of L in section.

Preferably, according to a seventh aspect, in the sample mount, the mount plate is in the form of a flat plate.

An eighth aspect is directed to a sample holder for holding a sample to be observed in an electron microscope. According to the eighth aspect, the sample holder comprises: a sample mount composed of a mount plate on which the sample is affixed and supported and a support plate for supporting the mount plate, the mount plate and the support plate being combined in the shape of L in section; and a holding portion for holding the support plate of the sample mount; wherein the mount plate has a gap whose width is narrower than the length of the sample and the sample is laid over opposite portions of the gap of the mount plate.

Preferably, according to a ninth aspect, in the sample holder, the holding portion holds the sample mount in such a manner that the part of the mount plate where the sample is affixed protrudes from the sample holder.

Preferably, according to a tenth aspect, in the sample holder, the holding portion comprises a first holding portion for holding the support plate in such a manner that the normal direction of the mount plate extends along the direction of electron beam incidence in the electron microscope, a second holding portion for holding the support plate in such a manner that the normal direction of the mount plate extends along a first direction which is vertical to the direction of the electron beam incidence, and a third holding portion for holding the support plate in such a manner that the normal direction of the mount plate extends along a second direction which is vertical to both of the direction of the electron beam incidence and the first direction.

Preferably, according to an eleventh aspect, in the sample holder, the holding portion holds the support plate in such a manner that the normal direction of the mount plate extends along the direction of electron beam incidence in the electron microscope or along a first direction which is vertical to the direction of the electron beam incidence and the holding portion can be rotated in the range of 0 to 360° about an axis extending along the first direction.

According to the first aspect of the invention, the sample mount is rotated in the range of 0 to 360° on a predetermined axis so that the sample can be observed from many directions. It is also possible to FIB-process the sample from many directions without removing the sample from the sample holder, thus facilitating the handling of the sample in the FIB processing.

According to the second aspect, the sample mount is rotated in the range of 0 to 360° on an axis extending along a direction other than the direction of the electron beam incidence in the electron microscope, which allows the sample to be certainly observed from many directions.

According to the third aspect, the sample holder has a cartridge portion coupled to the sample mount and a fixed portion coupled to the main body of the sample holder, where the cartridge portion can be attached to and removed from the fixed portion. It is therefore possible to easily replace the sample just by replacing the cartridge portion, thus improving the efficiency of the work.

According to the fourth aspect, the sample mount jig has a protecting portion which covers the sample affixed on the sample mount when the sample mount jig grasps and holds the sample mount. The protecting portion protects the sample from breakage etc. in storage of the sample.

According to the fifth aspect, the sample mount has a gap whose width is narrower than the length of the sample and the sample is positioned across opposite portions over the gap. Hence the electrons transmitted through the sample can pass through the gap to allow observation of the sample from many directions.

According to the sixth aspect, the mount plate on which the sample is affixed and supported and the support plate for supporting the mount plate are combined to form a sectionally L-shaped sample mount and the mount plate has a gap. Accordingly, the sample can be observed from more directions, and also can be handled easily since it can be handled together with the sample mount on which it is affixed.

According to the seventh aspect, the sample mount is formed like a flat plate so as to reduce the influence of scattered electron beam in EDS measurement, so as to improve the measuring accuracy.

According to the eighth aspect, the sample holder has the sample mount of the sixth aspect and a holding portion for holding the support plate of the sample mount, so that the sample can be observed from many directions and handled easily in the FIB processing.

According to the ninth aspect, the sample mount is held by the holding portion so that the part of the mount plate where the sample is affixed protrudes from the sample holder, so that the FIB processing can be easily applied from many directions and the sample can be handled more easily in the FIB processing.

According to the tenth aspect, the sample can be observed from three directions because the holding portion includes a first holding portion for holding the support plate so that the normal direction of the mount plate extends along the direction of electron beam incidence in the electron microscope, a second holding portion for holding the support plate so that the normal direction of the mount plate extends along a first direction which is vertical to the direction of the electron beam incidence, and a third holding portion for holding the support plate so that the normal direction of the mount plate extends in a second direction which is vertical to both of the electron beam incidence direction and the first direction. The sample can thus be observed from many directions and easily handled in the FIB processing.

According to the eleventh aspect, the holding portion holds the support plate so that the normal direction of the mount plate extends along the direction of electron beam incidence in the electron microscope or along a first direction which is vertical to the direction of the electron beam incidence, and the holding portion can be rotated in the range of 0 to 360° on an axis along the first direction. Therefore the sample can be observed from more directions and easily handled in the FIB processing.

It is therefore an object of the present invention to provide a sample holder and a sample mount which enable an objective sample to be observed from many directions in an electron microscope.

Another object of the present invention is to provide a sample holder, a sample mount and a jig for use with the sample mount which allow the sample to be handled conveniently.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing the main structure of a connecting part of a second preferred embodiment.

FIG. 15 is a diagram showing a sample holder according to a seventh preferred embodiment.

FIG. 17 is a diagram showing a sample holder according to an eighth preferred embodiment.

DESCRIPTION OF THE PREFERRED EMBODIMENTS

First Preferred Embodiment

Figure 1:
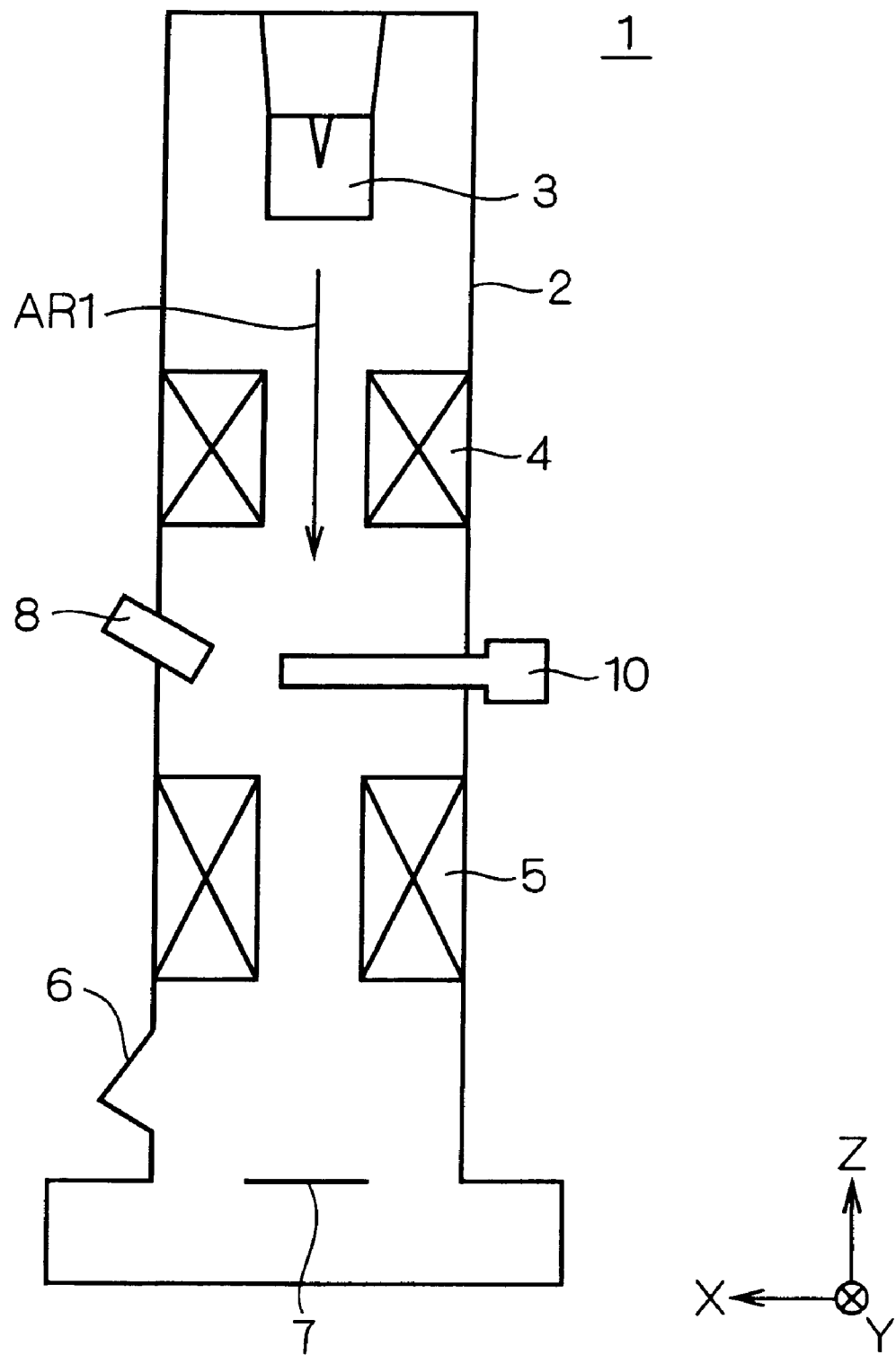
FIG. 1 is a schematic diagram showing an example of the structure of an electron microscope which uses the sample holders etc. of the present invention.

First, the whole structure of an electron microscope with which the sample holders etc. of the present invention are used is briefly described. FIG. 1 is a schematic diagram showing an example of the structure of an electron microscope which uses the sample holders etc. of the invention. Some drawings including FIG. 1 are shown with an XYZ orthogonal coordinate system as needed, to clearly show how they are directed relative to each other.

The electron microscope shown in FIG. 1 is a transmission electron microscope (TEM). The TEM 1 has a body tube 2 which principally contains an electron gun 3, a condenser lens system 4, and an objective lens system 5. The sample holder 10 can be inserted in and removed from the body tube 2 sideways. The sample holder 10 on which a sample to be observed is set is inserted into the body tube 2 to hold the observed sample in the sample chamber between the condenser lens system 4 and the objective lens system 5.

The inside of the body tube 2 is highly evacuated and the electron gun 3 emits electrons accelerated at high acceleration voltage. As shown by the arrow AR1, the electrons emitted from the electron gun 3 are condensed by the condenser lens system 4 and the electron beam hits the observed sample along the Z direction. The incident electrons are transmitted through the observed sample (part of them are scattered) and the objective lens system 5 causes the transmitted electrons to form an image on the fluorescent plane 7. The user observes the image formed on the fluorescent plane 7 from the observing window 6.

The TEM 1 of FIG. 1 is equipped with EDS (Energy Dispersive X-ray Spectroscopy); its detector 8 is attached to the body tube 2. In the EDS, the detector 8 measures the energy of characteristic X-rays generated as the electron beam enters the observed sample to analyze the composition of the observed sample. The TEM 1 may be equipped with other functions, such as a mechanism for photographing the image formed by the objective lens system 5, EELS (Electron Energy Loss Spectroscopy), etc.

Figure 2:
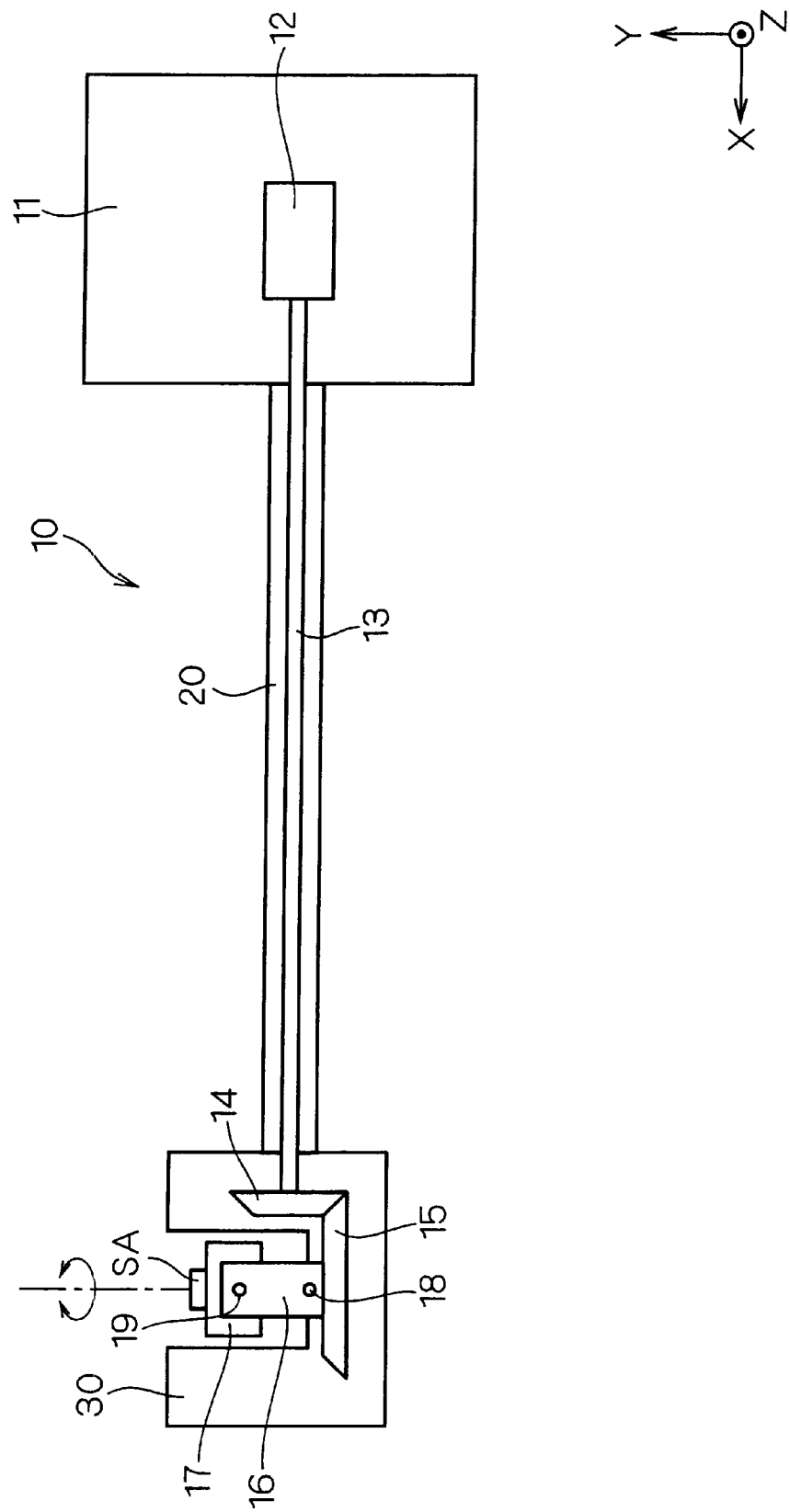
FIG. 2 is a diagram showing the structure of a sample holder.

FIG. 2 is a diagram showing the structure of the sample holder 10. This diagram shows the sample holder 10 seen from above, i.e. from the direction of incidence of the electron beam. The sample holder 10 has the main part 11, holding part 30 and connecting part 20 connecting the two. The main part 11 contains a motor 12 and the holding part 30 contains a bevel gear 15 and a bevel gear 14. The motor 12 and the bevel gear 14 are coupled through a rotating shaft 13 provided through the connecting part 20.

Figure 3:
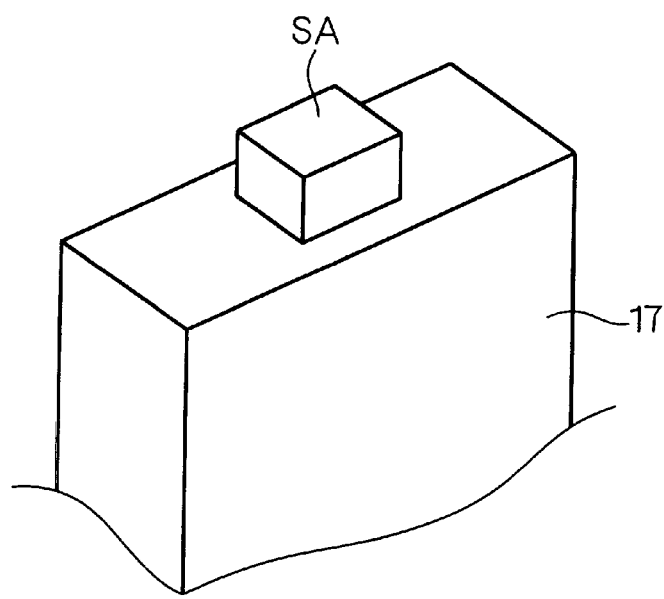
FIG. 3 is a diagram showing an observed sample affixed on a sample mount.

As shown in FIG. 3, the observed sample SA, a semiconductor device processed for observation with TEM, is fixed on a sample mount 17 with an adhesive such as a thermosetting resin. The sample mount 17 is fastened to the rotating mount 16 with screws 19 and the rotating mount 16 is fastened to the bevel gear 15 with a screw 18. The rotating mount 16 can rotate relative to the holding part 30 as the bevel gear 15 rotates. The bevel gear 15 is meshed with the bevel gear 14, which in turn is coupled to the motor 12 through the rotating shaft 13.

With this structure, normal or reverse rotation of the motor 12 on its axis extending in the X direction is transferred through the rotating shaft 13 to the bevel gear 14, which is then converted by the bevel gear 14 and the bevel gear 15 into rotation on the axis extending in the Y direction. The bevel gear 15 rotates to rotate the rotating mount 16, the sample mount 17 and the observed sample SA affixed on the sample mount 17 on the axis in the Y direction. The rotatable range of the sample mount 17 is not specifically limited; it can rotate in the range of 0 to 360° as needed.

The sample holder 10 itself can be turned on the axis extending in the X direction. The sample holder 10 is turned in a predetermined angle range by a goniometer attached to the body tube 2 of the TEM 1. The sample holder 10 turns to turn the observed sample SA around the axis in the X direction.

Thus the sample mount 17 on which the observed sample SA is affixed can be turned around the axis in the X direction by the goniometer attached to the TEM 1 and can be also rotated by the motor 12 in the range of 0 to 360° around the axis in the Y direction. The observing direction, or the direction of incidence of the electron beam, is in the Z direction, which means that the sample mount 17 on which the observed sample SA is affixed rotates in the range of 0 to 360° about the axis directed in a different direction from the incidence direction of the electron beam. Thus the electron beam can enter the observed sample SA from many directions; particularly it can enter the periphery around the Y axis in any directions, thus allowing the sample SA to be observed from many directions.

Figure 4:
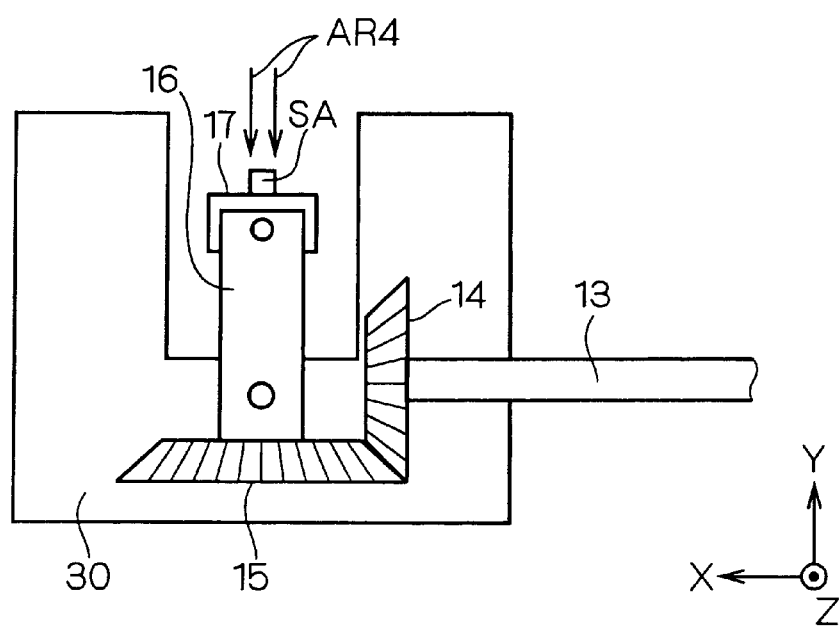
FIG. 4 is a diagram showing FIB processing to the observed sample on the sample holder of FIG. 2.

The sample holder 10 of this preferred embodiment also allows the sample SA to be FIB-processed without being removed from the sample holder 10. FIG. 4 is a diagram showing the FIB processing to the sample SA set on the sample holder 10. With the sample SA affixed on the sample mount 17 of the sample holder 10, the sample holder 10 is set in an FIB processing apparatus and a beam of Ga ions is applied to the sample SA from the Y direction as shown by the arrows AR4 in FIG. 4. For the FIB processing, the holding part 30 has an opened space on the (+Y) side seen from the sample SA. The ion beam can be applied to the sample SA from many directions since the sample mount 17 and the sample SA affixed on it can be rotated by the motor 12 in the range of 0 to 360° on the axis in the Y direction, which allows the sample SA to be processed in many directions.

In this way, the use of the sample holder 10 permits the sample mount 17 and the sample SA affixed on it to rotate in the range of 0 to 360° about the axis in the Y direction which is different from the electron beam incidence direction, thus allowing the sample SA to be observed from many directions. Moreover, it is possible to apply FIB processing to the sample SA in many directions without removing the sample SA from the sample holder 10, which simplifies the handling in the FIB processing.

Second Preferred Embodiment

Next, a second preferred embodiment of the present invention is described. The second preferred embodiment differs from the first preferred embodiment in that the connecting part 20 including the rotating shaft 13 is not integrally formed as one unit but can be disconnected; the structure is the same as that of the first preferred embodiment in other respects.

FIG. 5 is a diagram showing the main part of the structure of the connecting part 20 of the second preferred embodiment. The connecting part 20 can be separated into a cartridge section 21 and a fixed section 22. The cartridge section 21 is coupled to the holding part 30 including the sample mount 17. The fixed section 22 is fixed to the main part 11. The holding part 30 including the sample mount 17 and the main part 11 are the same in structure as those in the first preferred embodiment. The first rotating shaft 24 is connected to the motor 12 and hence rotates as the motor 12 rotates. The second rotating shaft 23 is connected to the bevel gear 14 and the bevel gear 14 hence rotates as the second rotating shaft 23 rotates.

When the cartridge section 21 is moved in the direction shown by the arrow AR5 in FIG. 5, the end of the cartridge section 21 fits into the fixed section 22. Further moving the cartridge section 21 causes the spline shaft 23a of the second rotating shaft 23 to fit into the spline hole 24a of the first rotating shaft 24. The spline shaft 23a has grooves formed along the length direction of the second rotating shaft 23 and the spline hole 24a has grooves into which they fit. The cartridge section 21 is then fastened to the fixed section 22 with fixing screws 25, with the spline shaft 23a fitting in the spline hole 24a.

The spline shaft 23a and the spline hole 24a are fitted together through the so-called spline fit, where their grooves engage with each other to transfer the rotating power. That is to say, when the cartridge section 21 is fixed to the fixed section 22 with the fixing screws 25, the spline shaft 23a fits in the spline hole 24a so that the rotation of the motor 12 is transferred to the bevel gear 14 through the first rotating shaft 24 and the second rotating shaft 23. Hence, as in the first preferred embodiment, the sample mount 17 on which the observed sample SA is affixed can be rotated in the range of 0 to 360° on the axis extending in the Y direction which is different from the direction of incidence of the electron beam, which allows the electron beam to enter the observed sample SA from many directions so that the observed sample SA can be observed from many directions. Furthermore, in the FIB processing, the ion beam can be applied to the observed sample SA from many directions, thus allowing FIB processing of the sample SA from many directions.

When the cartridge section 21 is connected to the fixed section 22, the cartridge section 21 can be separated and removed from the fixed section 22 just by loosening the fixing screws 25. Conventionally, the process of replacing the sample has been very difficult and unavoidably inefficient because the TEM-observed sample SA is so small. According to the second preferred embodiment, however, the sample can be replaced easily to improve the working efficiency by preparing a plurality of samples SA affixed on a plurality of sample mounts 17 coupled to the cartridge sections 21 and changing the cartridge sections 21 as needed.

As described above, in the second preferred embodiment, the cartridge section 21 coupled to the sample mount 17 can be attached to and removed from the fixed section 22 coupled to the main part 11 of the sample holder 10. It thus provides the same effects as those of the first preferred embodiment when the cartridge section 21 is connected to the main part 11. Further, the samples can be easily changed just by replacing the cartridge section 21, thus improving the working efficiency.

The means for connecting the first rotating shaft 24 and the second rotating shaft 23 is not limited to the spline fit; any means can be used as long as it can connect them so that the rotating power can be transferred from the first rotating shaft 24 to the second rotating shaft 23.

Third Preferred Embodiment

Next, a third preferred embodiment of the invention is described. The third preferred embodiment shows a sample mount jig for grasping and holding the sample mount 17 attached to the above-described sample holder 10.

Figure 6A:
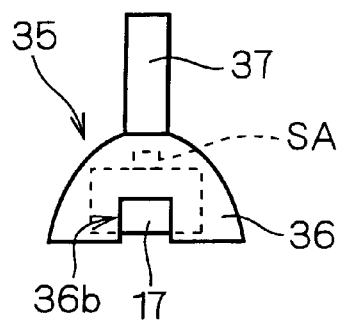
FIGS. 6A and 6B are diagrams showing a sample mount jig for grasping and holding the sample mount according to a third preferred embodiment.
Figure 6B:
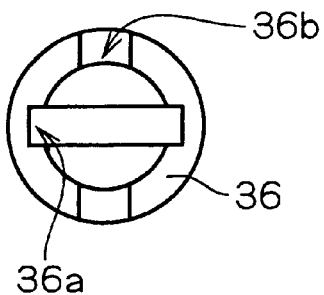

FIGS. 6A and 6B are diagrams showing a sample mount jig 35 for grasping and holding the sample mount 17. FIG. 6A is a side view of the sample mount jig 35 and FIG. 6B is a bottom view of the sample mount jig 35. The sample mount jig 35 has a protector section 36 which, when grasping the sample mount 17, covers the sample SA affixed on the sample mount 17, and a grip 37 fixed to the protector section 36. The protector section 36 has a fitting portion 36a in which the sample mount 17 fits and openings 36b. The fitting portion 36a is a groove shaped to fit the longer side of the sample mount 17.

Figure 7:
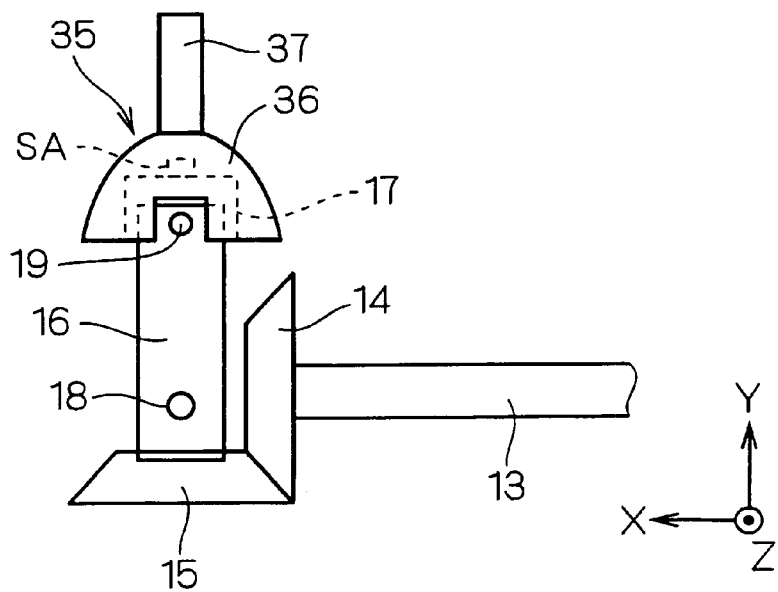
FIG. 7 is a diagram showing how the sample mount is attached and removed with the sample mount jig of FIG. 6.

FIG. 7 is a diagram used to explain how the sample mount 17 is attached and removed using the sample mount jig 35. With the sample mount 17 fixed to the rotating mount 16 with the screws 19, the sample mount jig 35 is moved closer to the sample mount 17 from the (+Y) direction and the sample mount 17 then fits in the fitting portion 36a. The protector section 36 of the sample mount jig 35 thus covers and protects the sample SA affixed on the sample mount 17. The screws 19 stay uncovered in the openings 36b. The screws 19 are then loosened through the openings 36b and the sample mount jig 35 is separated from the sample holder 10; the sample mount 17 grasped by the sample mount jig 35 is also separated from the rotating mount 16. The sample SA is then stored on the sample mount 17 fitted in the sample mount jig 35, so that the protector section 36 protects the observed sample SA from breakage etc.

The sample mount 17 can be attached to the sample holder 10 by the reverse procedure. That is to say, the sample mount jig 35 grasping and holding the sample mount 17 on which the sample SA is affixed is moved closer to the rotating mount 16 and the screws 19 are tightened through the openings 36*b* with the sample mount 17 abutting on the rotating mount 16. The sample mount jig 35 is then moved apart from the rotating mount 16 so that the sample mount 17 comes out from the fitting portion 36*a* of the sample mount jig 35, leaving the sample mount 17 attached to the sample holder 10.

As above, the use of the sample mount jig 35 of the third preferred embodiment eliminates the need for handling with tweezers to replace the sample SA, which facilitates the process and enhances the process efficiency. Furthermore, the use of the sample mount jig 35 allows the sample SA to be stored together with the sample mount 17 on which it is affixed, with the protector section 36 protecting the sample SA from damage etc.

Instead of the structure where the sample mount 17 is fixed to the rotating mount 16 with the screws 19, the sample mount 17 may have a threaded part which screws in the rotating mount 16. Also in this case, the above effect can be obtained by rotating the sample mount jig 35 with the sample mount 17 fitted in the fitting portion 36*a*.

Fourth Preferred Embodiment

Next, a fourth preferred embodiment of the invention is described. In the fourth preferred embodiment, a sample mount which is attached to the sample holder is described.

Figure 8:
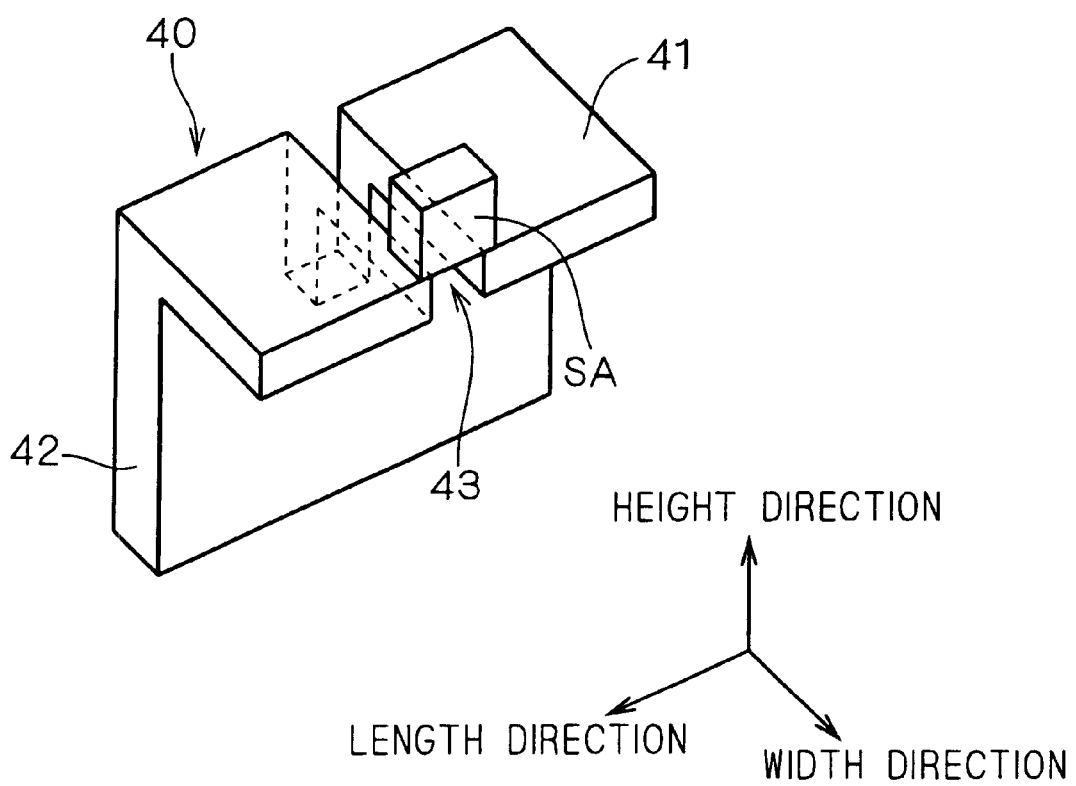
FIG. 8 is a perspective view showing a sample mount according to a fourth preferred embodiment.
Figure 9A:
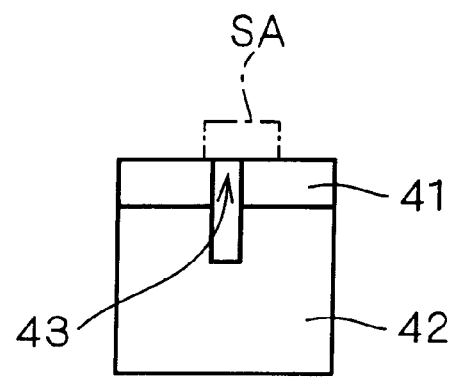
FIGS. 9A to 9C are a front view, side view, and plane view of the sample mount of FIG. 8.
Figure 9B:
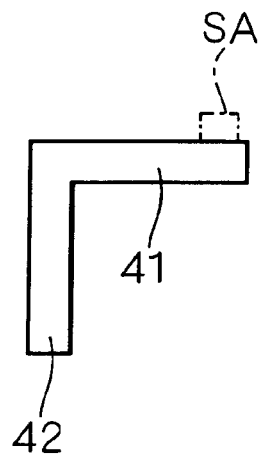
Figure 9C:
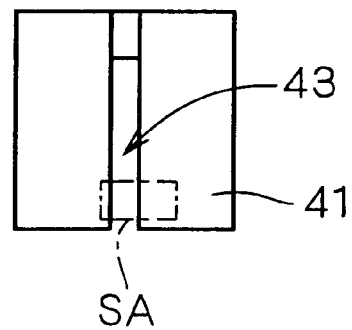

FIG. 8 is a perspective view showing a sample mount 40 of the fourth preferred embodiment. FIGS. 9A, 9B and 9C are a front view, side view and plane view of the sample mount 40, respectively. The sample mount 40 is formed of a mount plate 41 on which the observed sample SA is affixed and mounted and a support plate 42 supporting the mount plate 41; the mount plate 41 and the support plate 42 are combined together in L shape in section. The mount plate 41 has a gap 43 narrower than the length of the observed sample SA. The observed sample SA is laid over the opposite sides of the gap 43. The gap 43 continues in part of the support plate 42.

The length direction, height direction and width direction of the observed sample SA affixed on the sample mount 40 are defined as shown in FIG. 8. According to the sample mount 40 of the fourth preferred embodiment, the gap 43 allows the sample SA to be observed also in its height direction.

Figure 10:
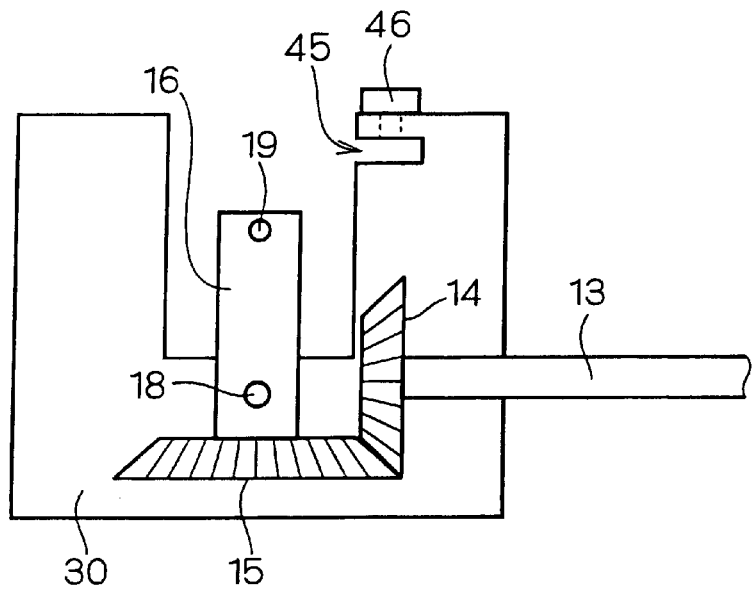
FIG. 10 is a diagram showing a sample holder using the sample mount of FIG. 8.

FIG. 10 shows a sample holder 10 for use with the sample mount 40 of the fourth preferred embodiment. This sample holder 10 differs from those shown in the first to third preferred embodiments in that the holding part 30 has a fixing groove 45. The support plate 42 of the sample mount 40 is inserted in the fixing groove 45 and the fixing screw 46 is tightened to fix the sample mount 40 to the holding part 30. The support plate 42 of the sample mount 40 may be fixed to the rotating mount 16 with the screws 19 as explained in the first to third preferred embodiments. In other respects the sample holder 10 of the fourth preferred embodiment is equivalent to the sample holder 10 shown in the first to third preferred embodiments (see FIG. 2).

Figure 11:
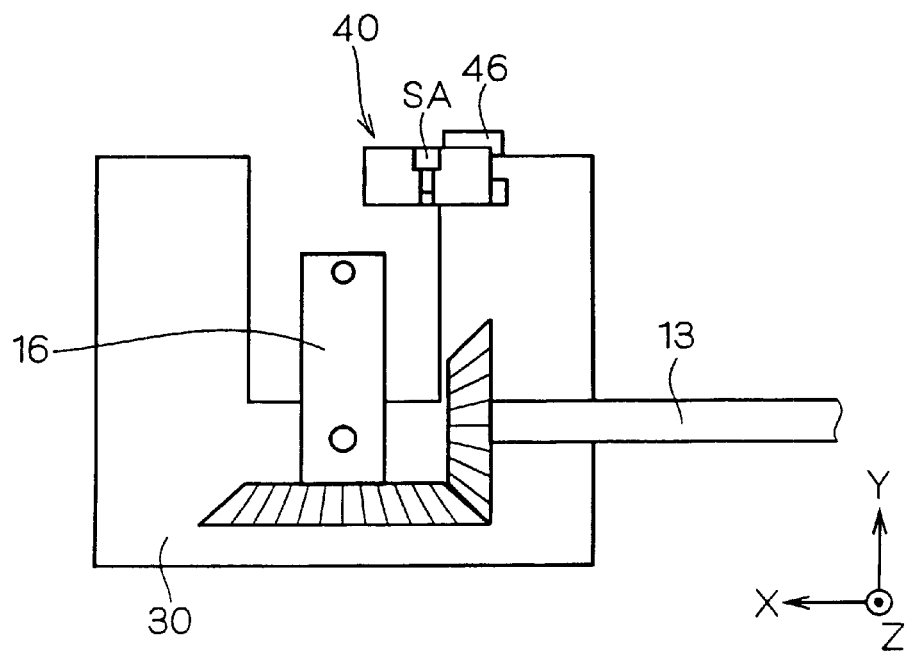
FIGS. 11 and 12 are diagrams showing observations of the sample using the sample mount of FIG. 8.
Figure 12:
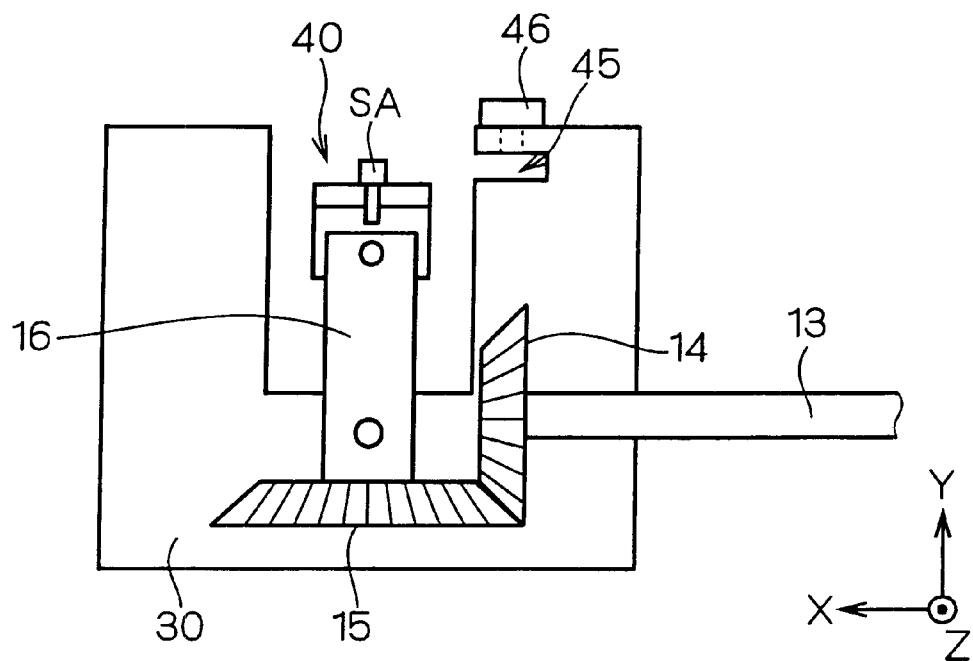

In the fourth preferred embodiment, the sample SA can be observed from its length direction, height direction and width direction through the use of the sectionally L-shaped sample mount 40. FIGS. 11 and 12 are diagrams showing the sample SA being observed by using the sample mount 40 of the fourth preferred embodiment. In FIG. 11, the support plate 42 of the sample mount 40 is fitted in the fixing groove 45 with the normal direction of the mount plate 41 directed along the Z direction, i.e. the direction of the incidence of the electron beam. The mount plate 41 has the gap 43 and the observed sample SA is positioned over the gap 43 across its opposite sides, so that the electron beam incident from the Z direction and transmitted through the observed sample SA in its height direction can pass through the gap 43. The sample SA can thus be observed from its height direction.

In FIG. 12, the support plate 42 of the sample mount 40 is fixed to the rotating mount 16. The direction of incidence of the electron beam (Z direction) and the mount plate 41 are parallel with each other in FIG. 12. In this case, as in the first preferred embodiment, the sample mount 40 on which the observed sample SA is affixed can be rotated by the motor 12 in the range of 0 to 360° about the axis in the Y direction. Therefore the sample SA can be observed from arbitrary directions in the plane formed by the length direction and the width direction of the sample SA, depending on the rotation angle of the sample mount 40.

As above, in the fourth preferred embodiment, the use of the sample mount 40 having the gap 43 enables the sample SA to be observed not only from its length direction and width direction but also from its height direction; the sample SA can thus be observed from a greater number of directions. Furthermore, the sample SA can be handled easily since it can be attached to and removed from the sample holder 10 by attaching and removing the relatively large sample mount 40 to and from the sample holder 10.

Fifth Preferred Embodiment

Figure 13:
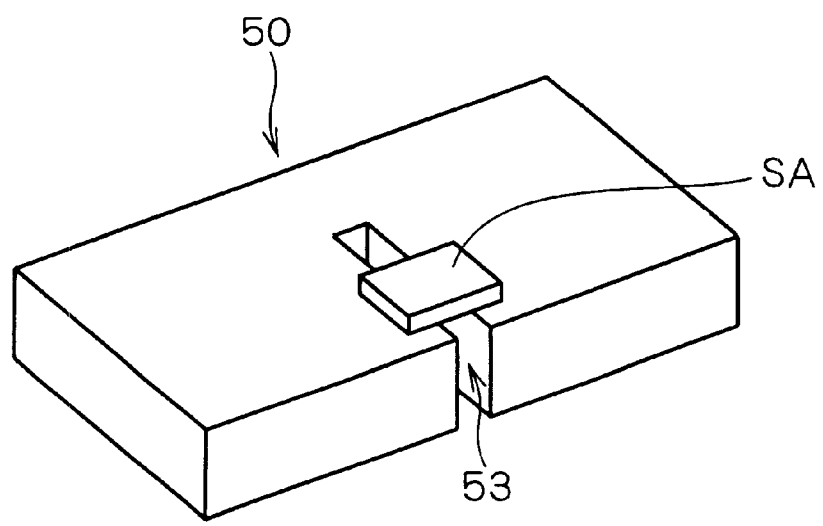
FIG. 13 is a perspective view showing a sample mount according to a fifth preferred embodiment.

Next, a fifth preferred embodiment of the present invention is described. FIG. 13 is a perspective view showing a sample mount 50 of the fifth preferred embodiment.

As already stated, the TEM 1 has EDS, where the detector 8 measures the energy of the characteristic X-rays generated as the electron beam enters the observed sample SA to analyze the composition of the observed sample SA. When the sample mount 40 as shown in the fourth preferred embodiment is used in this process, the scattered electron beam from the support plate 42 affects the sensitivity of the detector 8 to reduce the measuring accuracy.

Accordingly, the fifth preferred embodiment uses the plate-like sample mount 50 having a gap 53. The gap 53 has a width narrower than the length of the observed sample SA and the observed sample SA is laid over the opposing sides of the gap 53. The sample mount 50 on which the observed sample SA is affixed is fixed in the fixing groove 45 of the sample holder 10 of the fourth preferred embodiment, for example. The sample mount 50 is fixed with its normal direction directed along the Z direction or the direction of incidence of the electron beam.

Thus, as in the fourth preferred embodiment, the electron beam passed through the sample SA in its height direction can pass through the gap 53 and the sample SA can be observed from the height direction. Since the sample mount 50 is formed in the form of a flat plate, the measurement with EDS provides good accuracy without suffering from scattered electron beam which may be caused by the support plate 42 of the sample mount 40.

Sixth Preferred Embodiment

Figure 14A:
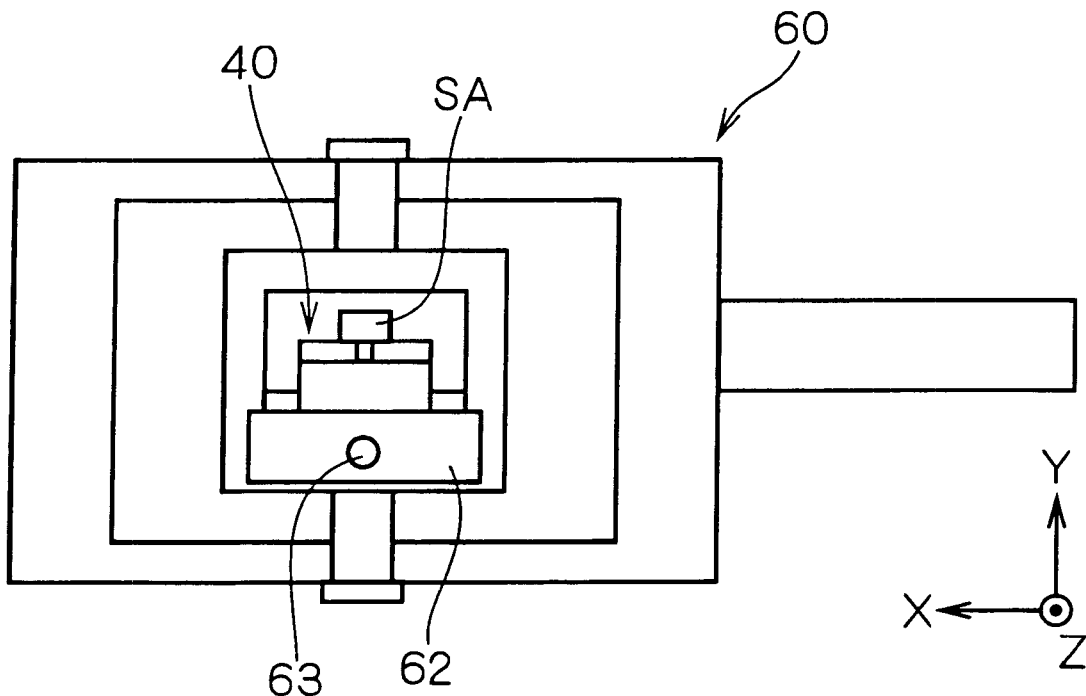
FIGS. 14A and 14B are diagrams showing a sample holder according to a sixth preferred embodiment.
Figure 14B:
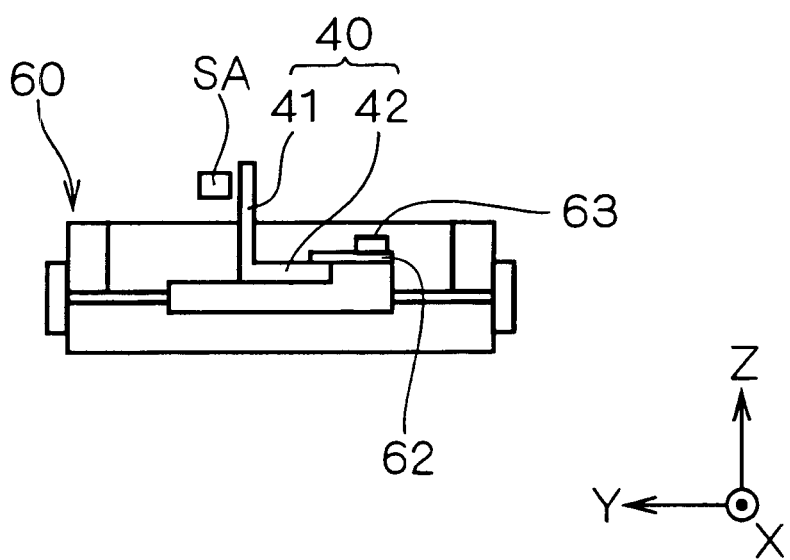
Figure 19A:
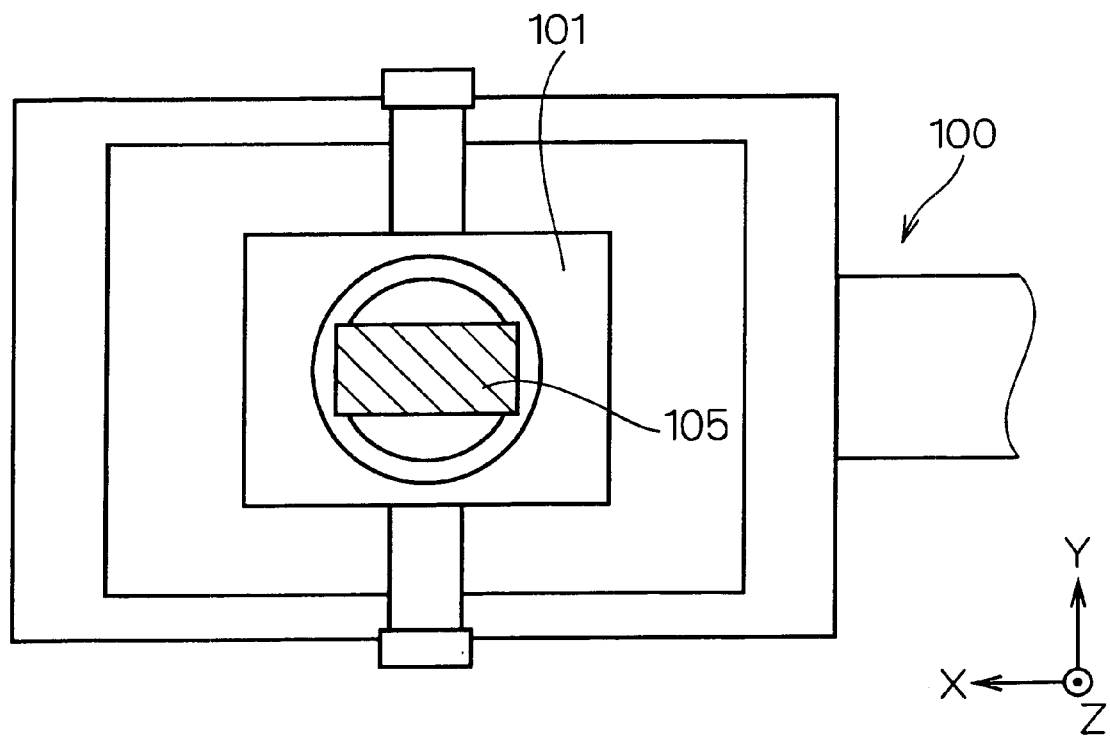
FIGS. 19A and 19B are diagrams showing a conventional common TEM sample holder.
Figure 19B:
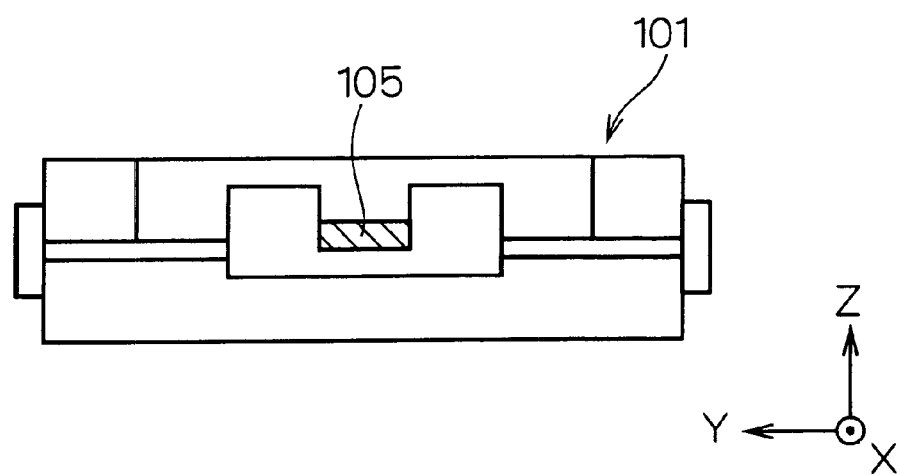
Figure 20:
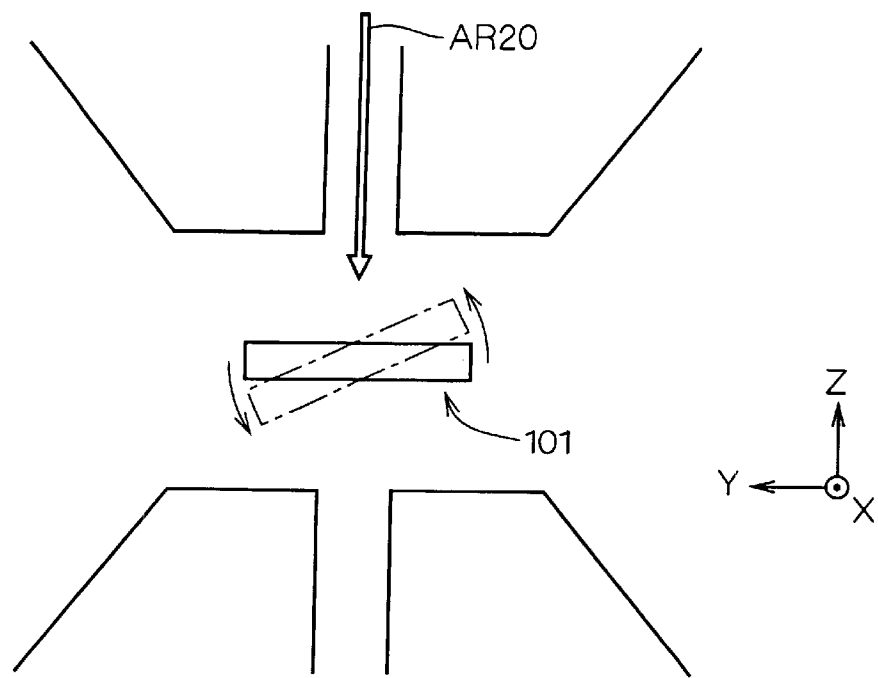
FIG. 20 is a diagram showing an observed sample being turned and inclined on an axis in the X direction using the conventional sample holder.
Figure 21:
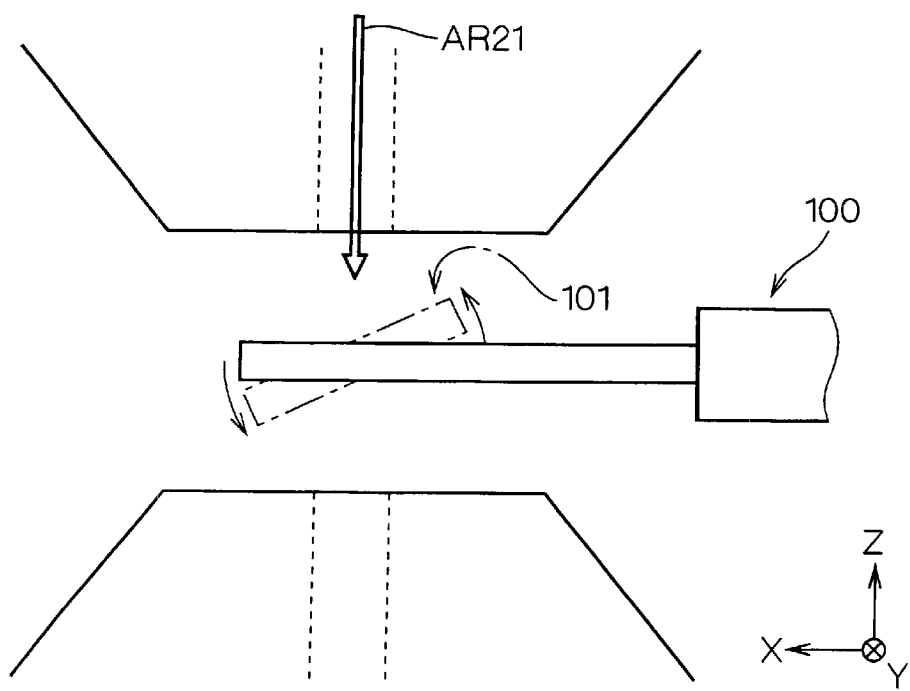
FIG. 21 is a diagram showing an observed sample being turned and inclined on an axis in the Y direction using the conventional sample holder.

Next, a sixth preferred embodiment of the invention is described. FIGS. 14A and 14B are diagrams showing a sample holder 60 of the sixth preferred embodiment. FIG. 14A is a plane view of the sample holder 60 and FIG. 14B is a front view showing its structure. This sample holder 60 is constructed by adding a clamp plate 62 and a screw 63 to the conventional common two-axis inclined sample holder (see FIG. 19). The sample mount 40 of the fourth preferred embodiment can be attached to the sample holder 60 by pressing the support plate 42 of the sample mount 40 with the clamp plate 62 and tightening the screw 63. That is to say, the clamp plate 62 and the screw 63 function as a holding portion for holding the support plate 42 of the sample mount 40. In other respects it is the same as the conventional two-axis inclined sample holder. The sample holder 60 can be said to be a modification of the conventional two-axis inclined sample holder which has been modified to allow attachment of the sample mount 40 of the fourth preferred embodiment.

As shown in the fourth preferred embodiment, the sample SA is laid over the opposing sides of the gap 43 of the mount plate 41. Then the sample mount 40 is attached to the sample holder 60 in such a manner that the Z direction or the direction of the electron beam incidence extends parallel to the mount plate 41. Accordingly the electron beam incident from the Z direction passes through the observed sample SA in its width direction to allow observation of the sample SA from its width direction. Needless to say, the sample holder 40 on which the observed sample SA is affixed is capable of the X-axis inclination and the Y-axis inclination like the conventional sample mount.

As stated in the first preferred embodiment, an ion beam is applied from the Y direction when applying the FIB process to the sample SA. As shown in FIG. 14B, the clamp plate 62 and the screw 63 hold the sample mount 40 in such a manner that the part of the mount plate 41 where the observed sample SA is affixed protrudes from the sample holder 60. Accordingly, when the sample mount 40 is attached to the sample holder 60, the (+Y) side seen from the observed sample SA is opened. It is therefore possible to FIB-process the sample SA without removing the sample SA from the sample holder 60, which facilitates the handling in the FIB processing.

Seventh Preferred Embodiment

Next, a seventh preferred embodiment of the invention is described. FIG. 15 is a diagram showing a sample holder 70 of the seventh preferred embodiment. A holding part 71 for holding the sample mount 40 is provided at the end of the sample holder 70. The holding part 71 has a holding screw 72, a holding screw 73, and a holding groove 75. The sample mount 40 shown in the fourth preferred embodiment is used in the seventh preferred embodiment. The sample holder 70 of the seventh preferred embodiment does not have a rotating mechanism.

Figure 16A:
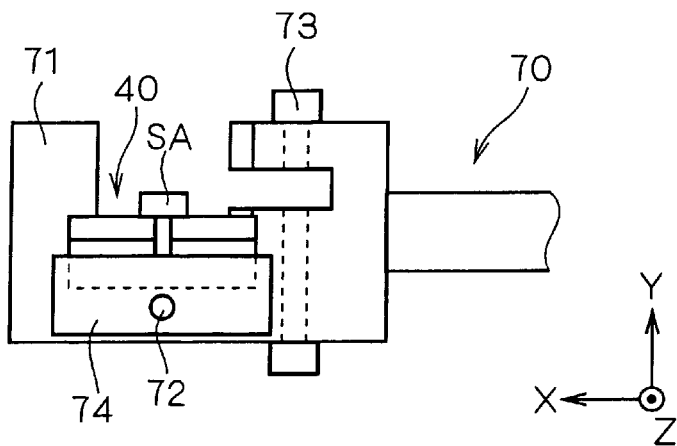
FIGS. 16A to 16C are diagrams showing the sample holder of FIG. 15 with the sample mount attached to it.
Figure 16B:
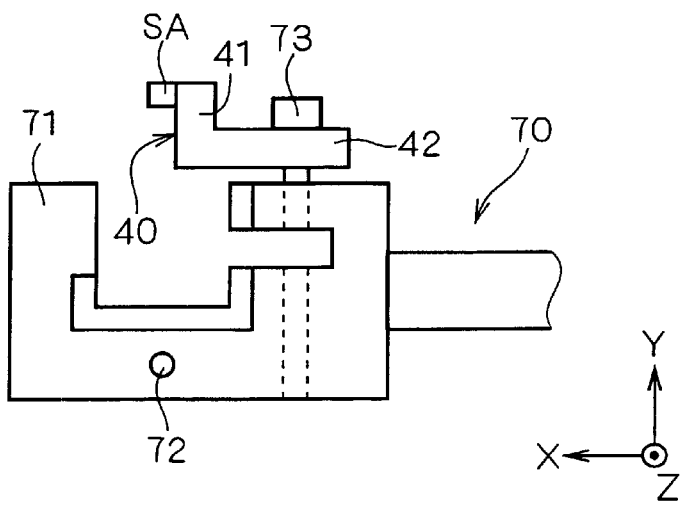
Figure 16C:
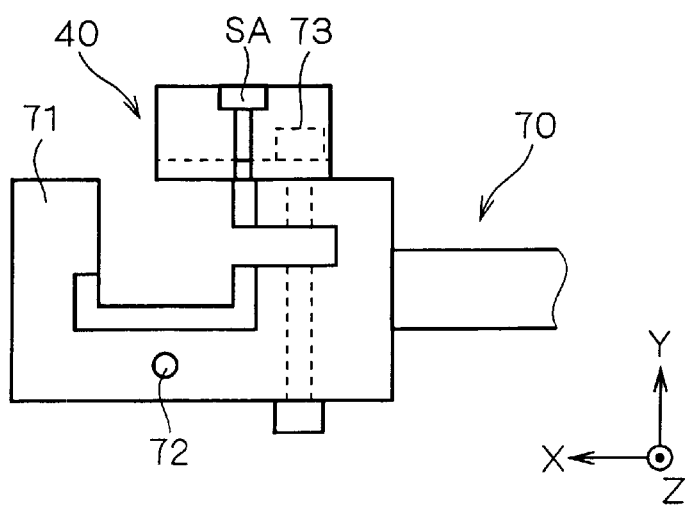

This sample holder 70 can hold in three ways the sample mount 40 on which the sample SA is affixed. FIGS. 16A to 16C are diagrams showing the ways in which the sample mount 40 is attached to the sample holder 70. First, as shown in FIG. 16A, the support plate 42 of the sample mount 40 is inserted between the holding groove 75 and the clamp plate 74 and the holding screw 72 is tightened to fix the sample mount 40. The mount plate 41 of the sample mount 40 extends parallel with the direction of the electron beam incidence and the normal direction of the mount plate 41 or the height direction of the observed sample SA extends along the Y direction. In this case, the electron beam incident from the Z direction passes through the observed sample SA in its width direction, thus allowing observation of the sample SA from the width direction.

Next, the support plate 42 is fixed to the holding part 71 with the holding screw 73 as shown in FIG. 16B to attach the sample mount 40. The support plate 42 has a hole through which the holding screw 73 passes. The normal direction of the mount plate 41 (the height direction of the observed sample SA) extends along the X direction. In this case, the electron beam incident from the Z direction passes through the observed sample SA in its length direction to allow observation of the sample SA from its length direction.

Finally, the support plate 42 is fixed to the holding part 71 with the holding screw 73 as shown in FIG. 16C to attach the sample mount 40. Unlike that shown in FIG. 16B, the normal direction of the mount plate 41 (the height direction of the observed sample SA) is directed along the Z direction. Since the mount plate 41 has the gap 43 as already stated and the observed sample SA is laid over the opposite sides of the gap 43, the electron beam incident from the Z direction and transmitted through the observed sample SA in its height direction can pass through the gap 43. The sample SA can thus be observed from its height direction.

As explained above, in the seventh preferred embodiment, the holding part 71 and the holding screw 73 realize a first holding portion which holds the support plate 42 with the normal direction of the mount plate 41 extending along the electron beam incidence direction (Z direction) in the TEM 1, and a second holding portion which holds the support plate 42 with the normal direction of the mount plate 41 extending along the X direction which is vertical to the electron beam incidence direction. Also, the holding part 71 and the holding screw 72 realize a third holding portion which holds the support plate 42 with the normal direction of the mount plate 41 extending along the Y direction which is vertical to both of the electron beam incidence direction and the X direction. Accordingly the sample SA can be observed from three directions, i.e. from a greater number of directions than in the conventional one.

Further, when the sample mount 40 is fixed as shown in FIG. 16B, the (+Y) side seen from the sample SA is opened. Then it is possible to FIB-process the sample SA without removing the sample SA from the sample holder 70, which facilitates the handling in the FIB process.

Eighth Preferred Embodiment

Next an eighth preferred embodiment of the invention is described. FIG. 17 is a diagram showing a sample holder 80 of the eighth preferred embodiment. The sample holder 80 has at its one end a holding part 81 for holding the sample mount 40. The holding part 81 includes a holding screw 83, a holding screw 84 and a holding groove 82. The sample mount 40 of the fourth preferred embodiment is used in the eighth preferred embodiment. The sample holder 80 of the eighth preferred embodiment does not have a rotating mechanism. However, the entirety of the sample holder 80 including the holding part 81 can be rotated in the range of 0 to 360° around the X-direction axis by a goniometer attached to the body tube 2 of the TEM 1.

Figure 18A:
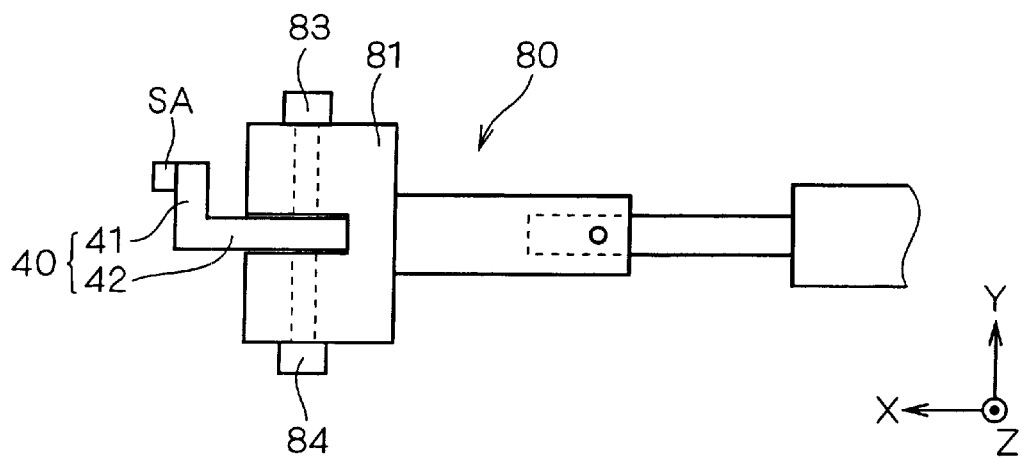
FIGS. 18A to 18C are diagrams showing the sample holder of FIG. 17 with the sample mount attached to it.
Figure 18B:
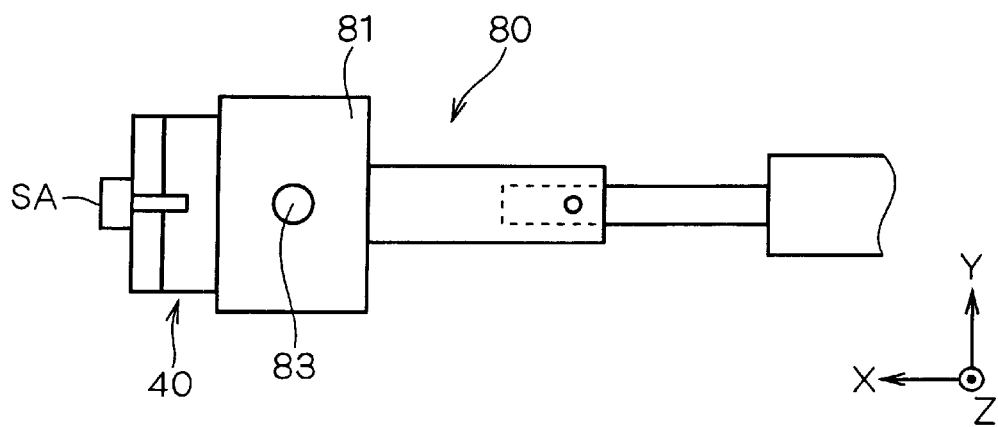
Figure 18C:
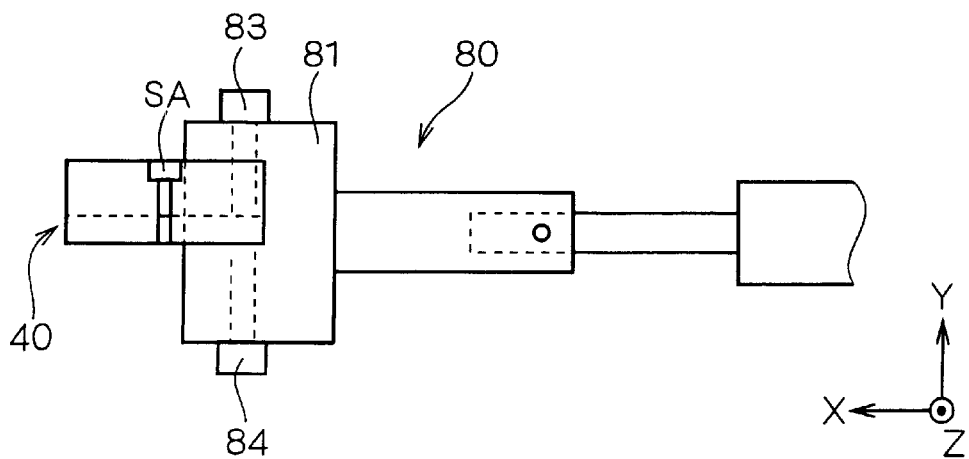

FIGS. 18A to 18C are diagrams showing the ways in which the sample mount 40 is attached to the sample holder 80. In FIG. 18A, the support plate 42 of the sample mount 40 is inserted in the holding groove 82 and pinched between the holding screw 83 and the holding screw 84, whereby the sample mount 40 is fixed. The mount plate 41 is parallel to the direction of the electron beam incidence (Z direction) and its normal direction is directed along the X direction. Accordingly, in the condition shown in FIG. 18A, the electron beam incident from the Z direction passes through the observed sample SA in its length direction, whereby the sample SA can be observed from its length direction.

The entirety of the sample holder 80 can be rotated in the range of 0 to 360° on the axis in the X direction. FIG. 18B shows the sample holder 80 rotated by 90° from the condition shown in FIG. 18A. Since the normal direction of the mount plate 41 lies along the X direction, the mount plate 41 stays parallel to the direction of the electron beam incidence (Z direction) even when rotated on the axis in the X direction. Accordingly, in the condition shown in FIG. 18B, the electron beam incident from the Z direction passes through the observed sample SA in its width direction, whereby the sample SA can be observed from the width direction. Thus, when the sample holder 80 is rotated, the sample SA can be observed from arbitrary directions on the plane formed by the length direction and the width direction of the sample SA depending on the rotated angle.

Also in FIG. 18C, the support plate 42 of the sample mount 40 is inserted in the holding groove 82 and is pinched between the holding screw 83 and the holding screw 84, whereby the sample mount 40 is fixed. In this case, unlike that shown in FIG. 18A, the normal direction of the mount plate 41 extends along the Z direction. Since the mount plate 41 has the gap 43 and the sample SA is laid over the opposite sides of the gap 43, the electron beam incident from the Z direction and transmitted through the observed sample SA in the height direction can pass through the gap 43. The observed sample SA can thus be observed from its height direction.

As described above, in the eighth preferred embodiment, when the holding part 81 holds the support plate 42 of the sample mount 40 in such a manner that the normal direction of the mount plate 41 is directed along the direction of the electron beam incidence in the TEM 1 (Z direction) or along the X direction which is vertical to the direction of the electron beam incidence. Further, since the entirety of the sample holder 80 including the holding part 81 can be rotated in the range of 0 to 360° about the X-direction axis, the sample SA can be observed from arbitrary directions in the plane formed by the length direction and the width direction of the sample SA and also from the height direction of the sample SA. The sample SA can thus be observed from a greater number of directions than in the seventh preferred embodiment.

In the eighth preferred embodiment, the (+Y) side seen from the observed sample SA is opened. Therefore it is possible to FIB-process the sample SA without removing the sample SA from the sample holder 80, which facilitates the handling in the FIB processing.

While the preferred embodiments above have shown applications of the sample holders etc. to a transmission electron microscope (TEM), they can be applied also to other types of electron microscopes, such as scanning electron microscopes (SEM), as needed.

While the invention has been described in detail, the foregoing description is in all aspects illustrative and not restrictive. It is understood that numerous other modifications and variations can be devised without departing from the scope of the invention.

What is claimed is:

1. A sample holder for holding a sample to be observed in an electron microscope, comprising:
    a sample mount on which said sample is affixed; and
    a rotation driving mechanism for rotating said sample mount about a predetermined axis in the range of 0 to 360°,
    wherein said predetermined axis extends along a direction other than a direction of electron beam incidence in said electron microscope, a position of said electron beam incidence in said sample being changed as said sample mount rotates.

2. The sample holder according to claim 1, further comprising:
    a cartridge portion coupled to said sample mount; and
    a fixed portion coupled to a main body of said sample holder,
    wherein said cartridge portion can be attached to and removed from said fixed portion.

3. A sample mount jig for grasping and holding a sample mount provided in a sample holder for holding a sample to be observed in an electron microscope, said sample mount jig comprising:
    a protecting portion for covering said sample affixed on said sample mount when said sample mount jig is grasping said sample mount; and
    a grip portion fixed to said protecting portion.

4. The sample mount jig according to claim 3, wherein said protecting portion has a fitting part in which said sample mount fits.

5. A sample mount on which a sample to be observed is affixed and which is provided in a sample holder for holding said sample in an electron microscope, said sample mount comprising:
    a mount plate having a gap whose width is narrower than the length of said sample, for supporting said sample affixed thereon,
    wherein said sample is laid over opposite portions of said gap of said mount plate, and wherein said gap extends throughout a thickness of said mount plate and extends from an end of said mount plate.

6. The sample mount according to claim 5, wherein said sample mount is composed of said mount plate and a support plate for supporting said mount plate, said mount plate and said support plate being combined in the shape of L in section.

7. The sample mount according to claim 5, wherein said mount plate is in the form of a flat plate.

8. A sample holder for holding a sample to be observed in an electron microscope, comprising:
    a sample mount composed of a mount plate on which said sample is affixed and supported and a support plate for supporting said mount plate, said mount plate and said support plate being are combined in the shape of L in section; and
    a holding portion for holding said support plate of said sample mount,
    wherein said mount plate has a gap whose width is narrower than the length of said sample and said sample is laid over opposite portions of said gap of said mount plate,
    wherein said gap extends throughout a thickness of said mount plate and extends from an end of said mount plate.

9. The sample holder according to claim 8, wherein said holding portion holds said sample mount in such a manner that a part of said mount plate where said sample is affixed protrudes from said sample holder.

10. The sample holder according to claim 8, wherein said holding portion comprises,
    a first holding portion for holding said support plate in such a manner that a normal direction of said mount plate extends along a direction of electron beam incidence in said electron microscope,
    a second holding portion for holding said support plate in such a manner that said normal direction of said mount plate extends along a first direction which is vertical to said direction of the electron beam incidence, and a third holding portion for holding said support plate in such a manner that said normal direction of said mount plate extends along a second direction which is vertical to both of said direction of the electron beam incidence and said first direction.

11. The sample holder according to claim 8, wherein said holding portion holds said support plate in such a manner that a normal direction of said mount plate extends along a direction of electron beam incidence in the electron microscope or along a first direction which is vertical to said direction of the electron beam incidence and said holding portion can be rotated in the range of 0 to 360° about an axis extending along said first direction.

12. A sample holder for holding a sample to be observed in an electron microscope, comprising:

a sample mount on which said sample is affixed;

a rotation driving mechanism for rotating said sample mount about a predetermined axis in the range of 0 to 360°;

a cartridge portion coupled to said sample mount; and a fixed portion coupled to a main body of said sample holder, wherein said cartridge portion can be attached to and removed from said fixed portion, wherein said rotation driving mechanism transmits power from said fixed portion to said cartridge portion, and wherein said rotation driving mechanism rotates said sample mount in the range of 0 to 360° about an axis extending along a direction other than a direction of electron beam incidence in said electron microscope.

* * * * *